(12) United States Patent
Figov

(10) Patent No.: US 6,609,459 B1
(45) Date of Patent: Aug. 26, 2003

(54) GRAVURE SHORT RUN PRINTING PLATE

(75) Inventor: Murray Figov, Ra'anana (IL)

(73) Assignee: Creo II Ltd., Herzlia (IL)

( * ) Notice: Subject to any disclaimer, the term of this patent is extended or adjusted under 35 U.S.C. 154(b) by 0 days.

(21) Appl. No.: 09/936,782

(22) PCT Filed: Mar. 20, 2000

(86) PCT No.: PCT/IL00/00176
§ 371 (c)(1),
(2), (4) Date: Nov. 14, 2001

(87) PCT Pub. No.: WO00/56554
PCT Pub. Date: Sep. 28, 2000

(30) Foreign Application Priority Data

Mar. 21, 1999 (IL) .................................. 129076

(51) Int. Cl.$^7$ ............................ G03F 7/095; G03F 7/36
(52) U.S. Cl. .................. 101/150; 101/395; 101/401.1; 430/307
(58) Field of Search ................. 101/150, 153, 101/170, 401, 401.1, 395; 430/307, 309, 310, 323, 328–330

(56) References Cited

U.S. PATENT DOCUMENTS

| | | | | |
|---|---|---|---|---|
| 2,980,535 A | * | 4/1961 | Schroeter | 430/307 |
| 3,559,570 A | | 2/1971 | Martel | |
| 3,636,251 A | | 1/1972 | Daly | |
| 3,832,948 A | | 9/1974 | Barker | |
| 3,948,644 A | * | 4/1976 | Wells | 430/307 |
| 4,565,771 A | | 1/1986 | Lynch | |
| 5,017,462 A | * | 5/1991 | Stahlhofen | 430/325 |
| 5,126,531 A | | 6/1992 | Majima | |
| 5,262,275 A | | 11/1993 | Fan | |
| 5,607,814 A | | 3/1997 | Fan | |
| 5,705,317 A | | 1/1998 | Eichhorn | |
| 5,840,463 A | | 11/1998 | Blanchet-Fincher | |
| 5,925,500 A | * | 7/1999 | Yang et al. | 430/309 |
| 5,994,032 A | | 11/1999 | Goffing | |
| 6,070,527 A | | 6/2000 | Yamane | |
| 6,143,470 A | * | 11/2000 | Nguyen et al. | 430/273.1 |
| 6,352,816 B1 | * | 3/2002 | Figov et al. | 430/309 |

FOREIGN PATENT DOCUMENTS

| | | |
|---|---|---|
| GB | 1229243 | 4/1969 |
| GB | 2034636 A | 7/1980 |
| IL | 122930 | 12/2000 |
| WO | PCT/IL97/00028 | 7/1997 |

OTHER PUBLICATIONS

Gravure Process and Technology, p. 380, Gravure Association of America.

* cited by examiner

*Primary Examiner*—Stephen R. Funk
(74) *Attorney, Agent, or Firm*—Edward Langer; Shiboleth, Yisraeli, Roberts, Zisman & Co.

(57) ABSTRACT

The present invention relates to a method and materials for producing digitally imaged short-run gravure printing plates and cylinders comprising the steps of providing an image-ready printing blank having a substrate, a UV curing layer, and an IR absorbing, UV-opaque layer. Alternatively, the blank plate can be provided in a two-part construction comprising the metallic substrate and an IR-sensitive film for either processless ablation or ablation transfer imaging. Digital imaging of the blank plate is performed using an IR laser which causes selective ablation of areas of the upper IR absorbing layer, thus forming an image structure having exposed and unexposed areas on the underlying UV curing layer. The plate is then flood-cured with UV radiation and washed to better expose the hardened image structure areas of the UV curing layer which have formed and which provide the cells for holding printing ink for use in the gravure printing process.

49 Claims, 15 Drawing Sheets

GRAVURE SHORT RUN PRINTING PLATE

FIELD OF THE INVENTION

This invention relates to a novel method and materials for producing digitally imaged short run gravure printing plates and cylinders.

BACKGROUND OF THE INVENTION

There are four principal traditional printing processes; flexography, offset lithography, screen printing and gravure. Each of these processes is distinguished by the location of the ink in relationship to the surface of the master and which areas of the master provide the non-ink or background areas. Flexographic plates have a raised surface that accepts the ink, the background being the recessed surface. In offset lithography, the ink and the background are coplanar and are differentiated chemically. Screen printing prints ink through holes in the master, with the background being provided by the remaining master surface. Gravure has the ink residing in indented cells, with the background being provided by the remaining upper surface.

Each printing method demands its own types of ink, its own imaging system and its own presses. Each process has its own advantages and disadvantages.

Despite the fact that gravure is regarded as a very simple process compared to other printing processes, its use is limited in commercial printing. "Gravure Process and Technology" from the Gravure Association of American (page 380) outlines the advantages and disadvantages of gravure. Gravure is more adaptable to less expensive papers and gives better image quality and color consistency than the other methods. However, the process of engraving gravure cylinders is costly and requires a significant amount of time. This makes the gravure process inappropriate for short runs and, indeed, it finds its place in very long runs of up to and beyond a million impressions.

Gravure cylinders are traditionally prepared either by imaging a photoresist through a film and them chemically etching the metallic surface of the cylinder or by directly engraving the cylinder with some type of engraving tool. A new method of preparation of gravure plates by precise digital indentation of cells is described in Israeli Patent No. 126,883 owned by the owners of the present invention. In recent years, with the advent of computers, origination for reproduction by printing processes has become available in digital form. Much work has been done in imaging printing plates digitally and, more specifically, using a modulated laser beam. An example of such an imaging system is the inventor's application PCT/IL97/00028, "An Imaging Apparatus For Exposing A Printing Member And Printing Members Thereof". This patent application is concerned with digital offset lithographic printing using a laser imaging system.

Because of the necessity for engraving specific holes to produce the cells needed for gravure, there have been many attempts to use lasers for digital imaging. For example, U.S. Pat. No. 3,636,251 to Daly et al. describes a system for engraving intalgio printing plates by forming cells in a metal plate using a pulsed output laser. UK Patent Application, GB 2034636A to Pugsley claims that the Daly patent method has the disadvantage that it tends to produce rims around the gravure cells. The Pugsley patent claims an advantage in using polymeric printing blanks for laser engraving, where such blanks have high thermal conductivity. The areas struck by the laser are vaporised. Carbon black may be incorporated into the polymer to improve absorption of the laser energy. More recently, U.S. Pat. No. 5,126,531 to Majima et al. described a method of producing a gravure printing plate using a thermoplastic resin sheet containing about 20 percent carbon. The plate was wrapped around a cylinder and imaged by a semi-conductor laser beam.

Laser imaging as described in the above patents requires large amounts of energy to ablate cells of the required depth for gravure printing. This is achieved either by expensive high-powered lasers or by long imaging times.

It is necessary for gravure plates to be made of materials which can withstand the high pressures involved in gravure printing. Both the printing press and the cleaning blade exert strong pressure on the gravure plate. This is not so for flexography, which is a relatively low-pressure process. Therefore, methods devised for producing flexographic plates, such as the method described in U.S. Pat. No. 5,607,814 are unsuitable for producing gravure plates.

It would be desirable to find a simpler and faster method of producing gravure cylinders or plates that would not require expensive lasers, so that the quality of gravure could be enjoyed by print purchasers who only require some thousands of impressions per job.

SUMMARY OF THE INVENTION

Accordingly, it is a broad object of the present invention to overcome the problems of the prior art and provide a novel gravure short-run plate using an integral UV mask.

In accordance with a preferred embodiment of the present invention, there is provided a method for preparing a gravure printing blank usable in a gravure printing process, said method comprising the steps of:

providing an image-ready printing blank comprising:
  a substrate;
  a UV curing layer; and
  an IR absorbing, UV opaque layer;

digitally imaging said printing blank with a digital laser imaging system using an IR laser, such that the IR irradiation causes selective ablation of areas of said IR absorbing layer, forming an image structure having exposed and unexposed areas of said UV curing layer;

flood-curing said printing blank with UV radiation to cure said exposed areas of said UV curing layer in said image structure; and washing said printing blank so that remaining IR absorbing layer areas and said unexposed image structure areas are removed, such that the remaining UV cured image structure areas of the UV curing layer form cells for holding printing ink for use in the gravure printing process.

In accordance with another aspect of the invention there is provided an image-ready gravure printing blank, comprising:
  a substrate;
  a UV curing layer disposed on said substrate; and
  an IR absorbing, UV opaque layer.

In accordance with yet another aspect of the invention there is provided a gravure printing blank usable in a gravure printing process, said printing blank comprising:
  a printing blank comprised of a substrate, a UV curing layer and an IR absorbing, UV opaque layer;
  said printing blank having been imaged with a digital laser imaging system using an IR laser, such that the IR irradiation causes selective ablation of areas of said IR absorbing layer forming an image structure having exposed and unexposed areas of said UV curing layer;

said printing blank having been further cured with UV radiation to cure said areas of said UV curing layer which have been exposed by said image structure; and said printing blank having been further washed so that areas which have not been UV cured are removed, such that the remaining UV cured areas of the UV curing layer form cells for holding printing ink for use in the gravure printing process.

In a preferred embodiment, a gravure printing blank is provided that can be easily and quickly imaged by means of digital laser imaging. The polymer-metal printing blank is provided as polymeric layers coated onto metal, wherein the polymer surface interfaces with the printing ink and the metal provides the high dimensional stability. The exposed polymer coat is an infrared (IR) absorbing layer. Selective irradiation with IR causes ablation of those areas of the IR absorbing layer which are exposed to IR. After IR irradiation has selectively ablated the exposed surface, the plate is flooded with UV radiation. Below the IR absorbing layer is an ultraviolet (UV) curing layer. Those areas in which the IR absorbing layer has been ablated allow passage of the UV light to the UV curing layer. The areas in which the IR absorbing layer remains are not cured. Subsequently, the remaining IR absorbing layer and the uncured areas of the UV curing layer are washed away leaving the hardened background areas of the UV curing layer on the gravure plate or cylinder, forming the cells.

In a further alternative embodiment of the invention, the gravure printing plate is provided in a two-part construction with an additional infrared sensitive film provided with the IR absorbing layer on it. The UV curing layer is provided on the substrate. For use in the printing process the two parts are placed together with the film resting on the UV curing layer. The image is made on the IR absorbing layer by processless ablation, then the IR absorbing layer is used as a mask during UV flood curing. After the curing stage the film is peeled away along with the IR absorbing layer. The remaining UV curing layer is then washed to remove the uncured portions, forming cells for holding the ink during the gravure printing process.

In yet a further alternative embodiment of the invention, the gravure printing plate is provided in a two-part construction with an additional infrared sensitive film provided with the IR absorbing layer on its underside. The two parts are placed together with the IR absorbing layer resting on the UV curing layer. The image is made on the IR absorbing layer through ablation transfer, then the transferred layer acts as a mask during UV flood curing. The remaining UV curing layer is then washed to remove the uncured portions, forming cells for holding the ink during the gravure printing process.

In any of the embodiments, an optional second UV flood-curing may be performed to complete curing to give a very insoluble film capable of resisting the solvents of gravure inks such as toluene and ethyl acetate.

In any of the embodiments, an optional baking treatment at 200° C.–250° C. for a period between 1 and 10 minutes may also be performed for further improvement of solvent resistance and adhesion.

In yet another alternative embodiment, after the cells have been formed, in any of the embodiments, the metallic substrate of the plate may be etched to deepen the cells. In this case, it is possible to remove the UV curing polymer layer completely and use the cells etched in the metallic substrate for the printing plate.

In yet another further embodiment, after the optional etching process, the metallic substrate may go through a plating process. This allows a longer run using the gravure plate.

Other features and advantages of the invention will become apparent from the following drawings and descriptions.

BRIEF DESCRIPTION OF THE DRAWINGS

For a better understanding of the invention with regard to the embodiments thereof, reference is made to the accompanying drawings, in which like numerals designate corresponding elements or sections throughout and in which.

DETAILED DESCRIPTION OF THE INVENTION

Figure 1:
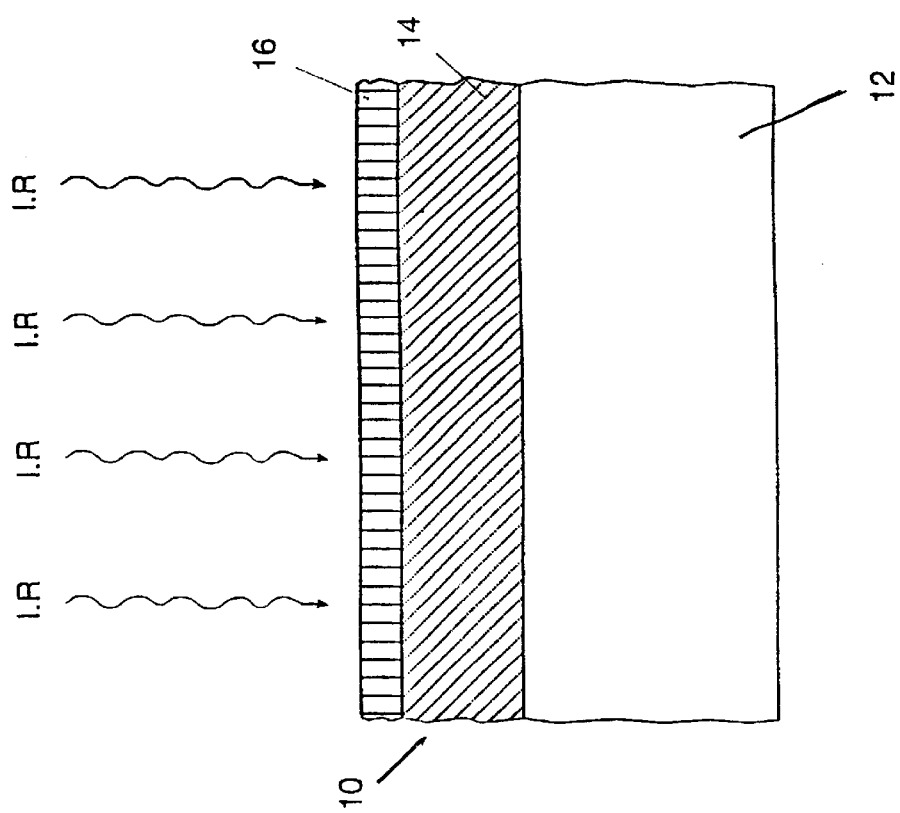
FIG. 1 represents a cross-sectional view of the plate material or cylinder surface for forming a gravure printing plate, constructed in accordance with a preferred embodiment of the present invention, being digitally imaged in selected areas by infrared radiation.

Referring now to FIG. 1, gravure printing blank 10 may be provided in the form of a coated cylinder or of a flexible printing plate that can be mounted on a cylinder for both imaging and printing. FIG. 1 shows the structural composition of the printing blank, comprising three layers. Layer 12 is the substrate, which is composed of a plastic, a metal or metal laminate which may be anodised or otherwise treated. By way of example, materials which may be used are polyester, anodised aluminum, aluminum metal, copper, copper plated aluminum, chromium, chromium plated copper or metal plated or laminated onto plastic. Substrate 12 is coated with a UV curing, aqueous-soluble layer 14 that may be anything from 5 microns to 50 microns thick as a dry film. This somewhat depends on its functionality as described below. The composition of UV curing layer 14 is comprised of the following components;

a) Oligomers and monomers that can be cross-linked in the presence of a photoinitiator by means of irradiation with ultra violet light. The total amount of these is between 25% and 85% by weight of the dry solids.

b) Photoinitiators and synergists that generate and promote free radicals needed for the cross-linking reaction described in (a). These are present as up to 10% by weight of the olgiomers and monomers.

c) Binder resins that are soluble in both water or dilute alkali and also in non-aqueous solvent. These are present in quantities from 10% to 50% by weight.

In addition, there are optional ingredients such as fillers and wetting agents, and dyes or pigments to aid visual examination of the layer. The entire mixture is deposited as a coating from a non-aqueous solvent.

A large range of UV curable materials can be used in layer 14. It has been found advantageous in embodiments where the final printing plate still retains the cross-linked photopolymer to incorporate a silicone derivative to lower the surface energy of the finished plate so that the wiping of the ink from the surface is facilitated. Examples of such reactive additives are EBECRYL 350 (a silicone diacrylate sold by UCB) and EBECRYL 1360 (a silicone hexacrylate sold by UCB). Photoinitiators can be chosen from those known to the art.

The resins used are restricted to those showing suitable duality of solubility in both aqueous and non-aqueous solvents. This would exclude such resins as, for instance, polyvinyl chlorides which may be non-aqueous solvent soluble, but not aqueous solvent soluble. Also it would exclusive polyvinyl alcohols which are not soluble in non-aqueous solvent. The resin system must be solvent soluble (as well as aqueous solution soluble) so that the monomers and olgiomers of section (a) will dissolve easily and give a compatible dry film. The resins must have aqueous solubility, albeit at a pH of greater than 8, so that as described below the uncured layer can be washed away.

Although it is possible to wash the layer away with volatile organic solvent, it is not environmentally desirable to do so. However, nonvolatile organic materials such as ethyl lactate may be used. Examples of types of resins that are useful in the system are novalak (functionally substituted phenol-formaldehyde resins), styrene maleic anhydride copolymers, polyvinyl methyl ether/maleic anhydride copolymer and its esters, hydroxy propyl cellulose and esterified rosin-maleic esters.

IR sensitive, UV opaque layer 16 is coated on top of UV curing layer 14. The solvent used is preferably water, and although water soluble binders may be present, it is preferable to either include a small amount of an aqueous emulsion containing binder or to omit binder from this layer entirely. It is not possible to use a non-aqueous solvent-based top layer unless such solvent does not attack the film of the layer 14. Although some small amount of solvent penetration from the top coat to the undercoat is expected, solvent attack of layer 14 is likely to adversely affect the quality of the imaging by ablation and to leave residual top layer 16 on underlayer 14 after imaging, thus interfering with the UV curing stage. This remains of layer 16 after selective ablation are washed away after UV exposure as described.

The prime ingredient of layer 16 is the infrared absorbing, UV blocking material. This is preferably carbon black. This layer may also contain surface active agents, aqueous emulsion binders and UV absorbing materials such as dyes or pigments to enhance performance when this layer is used as a mask and may contain infrared absorbing materials other than carbon black. The total thickness of this layer can be anywhere between 0.3 microns to 6 microns. Layers 16 and 14 are constructed such that once the total composite is made, top layer 16 is not easily physically damaged by handling. This is achieved by the interaction of layers 16 and 14. Thus, if the identical coating 16 were to be made directly onto polyester film or onto metals such as aluminum or copper, the dried film would be very easily removed by gently rubbing with a finger. This is easily understood when there is little or no binder present as it would be expected that without sufficient binder or any binder at all the layer would have no physical strength. It is, however surprising that the coating 16 exhibits rub resistance under conditions identical to those that could be used to coat directly onto substrates such a metals or polyester when coated on layer 14 are described. This is particularly important as it permits layer 16 to be formulated with optimum sensitivity to infrared radiation, i.e. without the need to dilute the IR sensitive material with binder, while at the same time allowing layer 16 to have sufficient UV optical density to give adequate masking during the curing stage of the process.

During the digital imaging of the printing blank, layer 16 is selectively ablated and debris collected by a suitably located vacuum system. Optionally, after ablation, the surface may be wiped with a dry cloth to ensure that no debris remains. The ablation for digital imaging is done by laser diodes. A suitable imaging system is that described in PCT Patent Application PCT/IL97/00525 (Publication No. WO 97/27065) to the present Applicant, incorporated herein by reference.

Figure 2:
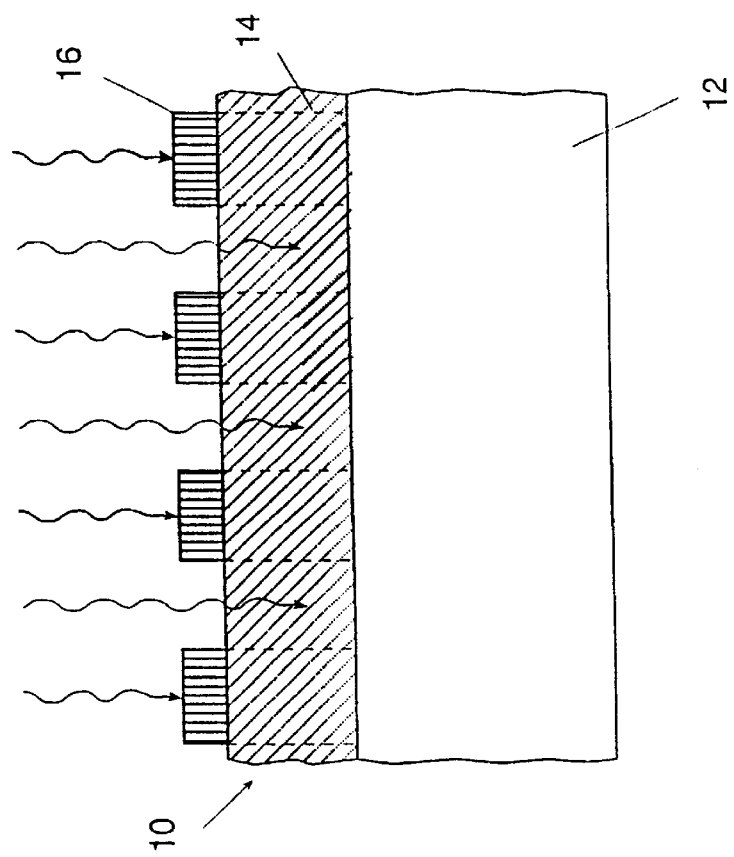
FIG. 2 shows a cross-sectional view of the second stage of the process during which the material is flood-exposed with UV radiation.

FIG. 2 shows gravure printing blank 10 with imaged areas of coating 16 ablated away. The remaining unablated areas of 16 then act as a mask for flood UV exposure as shown in this figure. The UV radiation selectively hardens the underlayer 14 in the areas previously imaged by IR irradiation. Whereas the use of an ablated mask is known for flexographic printing (see, for instance U.S. Pat. No. 5,607,814), it is not known for gravure. Gravure plates present different problems from flexographic plates. The pressure on the flexographic plate during printing is very low. The plate, which has raised images that can be measured in heights of millimeters, has great flexibility and no need for resistance to the high printing pressures and pressures from the cleaning blade that are experienced in gravure. Thus a plate developed for the flexography process would be totally unsuitable for the gravure process. Moreover, it is general practice in flexographic plates to use a transparent substrate so that partial pre-imaging curing of the thick UV curable layer can be made from the back side of the plate. The Applicant has found that better results are obtained with metal than with polyester in the present invention because the bonding between the polymerised UV cured resin system and the polyester surface is less able to withstand the forces at work during gravure printing.

Figure 3:
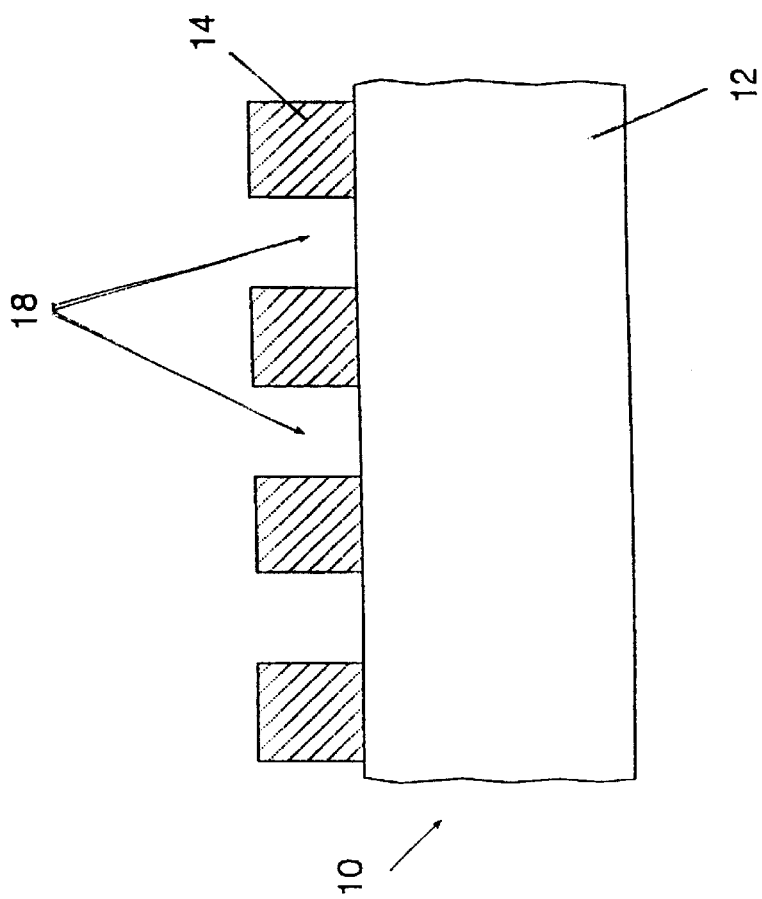
FIG. 3 is a cross-sectional view of the plate after an aqueous alkali wash.

FIG. 3 shows printing blank 10 after the non hardened areas have been washed away by an aqueous alkali solution, forming ink cells 18. The solution also washes away the remaining unablated areas of the infrared sensitive layer 16 (no longer visible in FIG. 3). This is different from other ablated masking processes as used in flexography because the relative thin layer 16 needs less of a UV contrast between the image and non-image areas in order to produce the solubility contrast between the cured and uncured areas of layer 14. The thick UV curable layer used for flexographic printing such as described in U.S. Pat. No. 5,607,814 needs so much energy to completely cure the thick layer that unless the mask is sufficiently opaque, it will permit partial curing of the surface layer. If such masks used are ablatable, they need to be so thick that the energy for ablation may be as high as 4 Joules per square centimeter.

Figure 4:
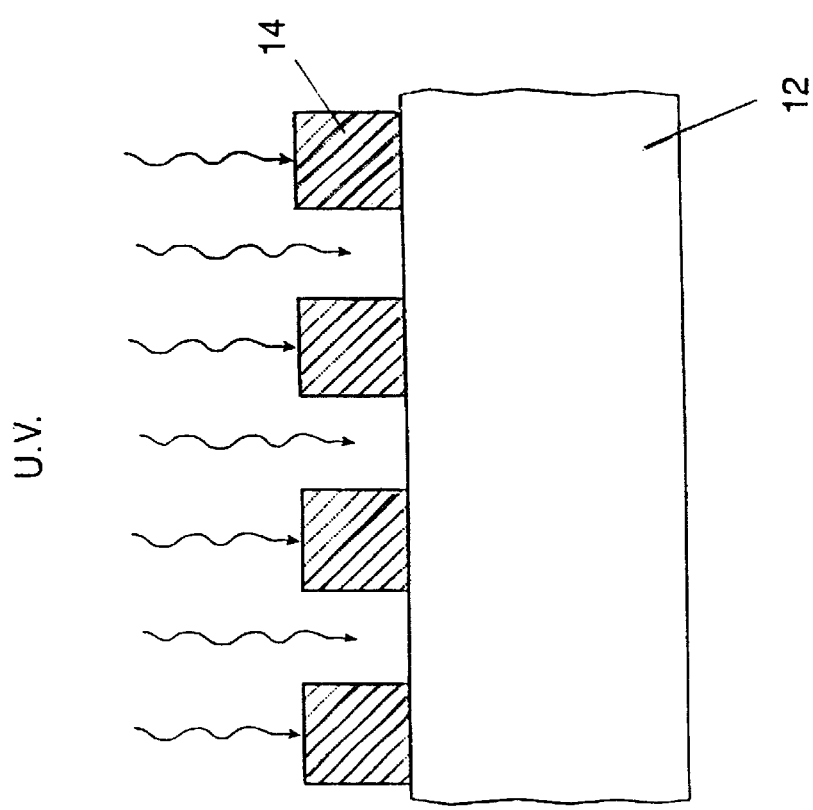
FIG. 4 is a cross-sectional view of an optional UV curing stage.

FIG. 4 shows an optional stage of UV flood-curing after washing. It is possible that curing as shown in FIG. 2 is sufficient to give good differences in solubility between image and background without giving complete curing of the layer 14. The post-washing curing may then complete curing to give a very insoluble film capable of resisting the solvents of gravure inks such as toluene and ethyl acetate. A baking treatment at 200° C. to 250° C. may also be performed for further improvement of solvent resistance and adhesion. Further treatment to improve the resistance of the background and cell way to the gravure ink may be made by polishing with silicone oil.

Figure 5:
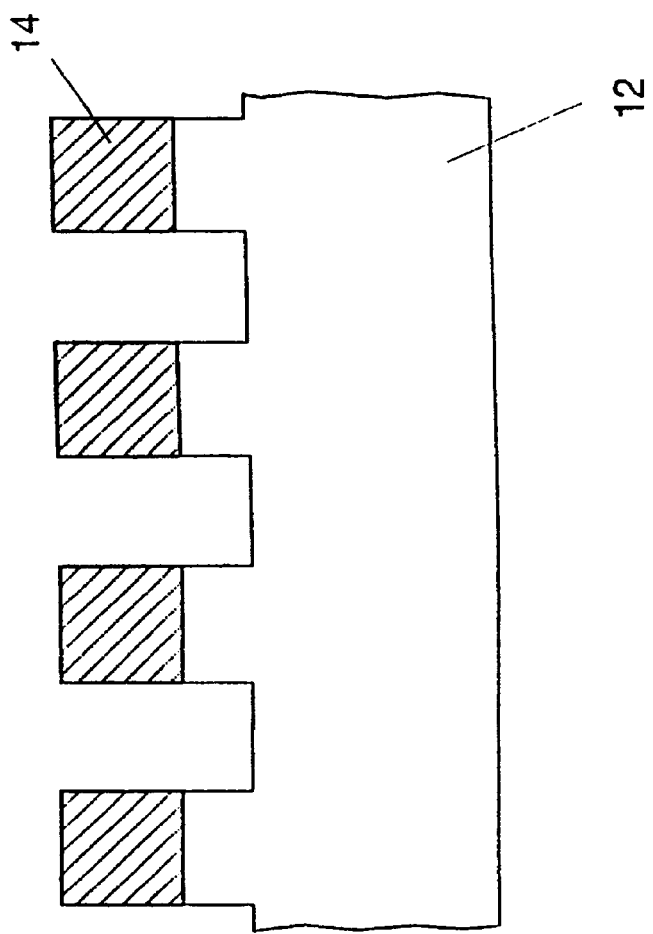
FIG. 5 shows an optional etching of the metal substrate.

FIG. 5 shows an additional optional etching stage which may be applied with or without the process shown in FIG. 4. This is especially applicable to aluminum, copper and chromium substrates. The blank products from the stages shown in FIGS. 3 or 4 is additionally treated with acid or alkali to further deepen the cells produced by the use as a mask of those areas of layer 14 remaining after the alkali wash.

Figure 6:
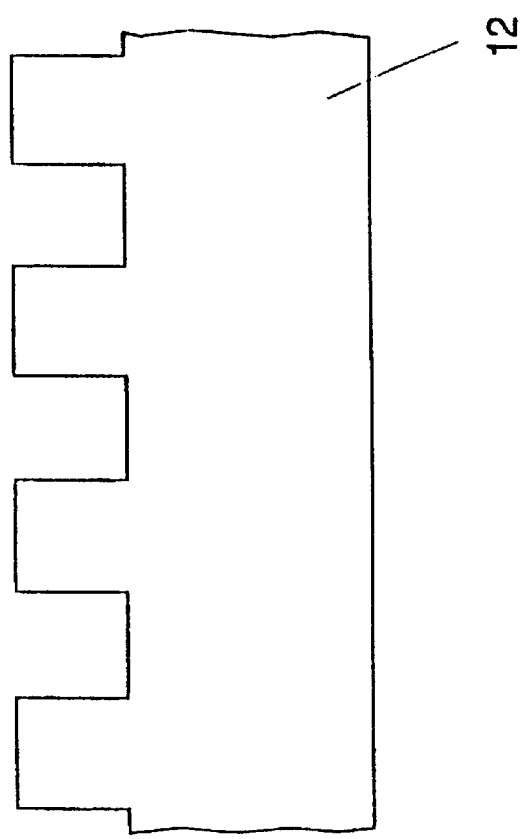
FIG. 6 shows a stage of removal of the phototool mask.

Optionally, layer 14 can be removed by abrasion or solvent treatment, after the etching treatment in FIG. 5. The gravure plate resulting from this will have a metal upper surface. This is shown in FIG. 6.

Figure 7:
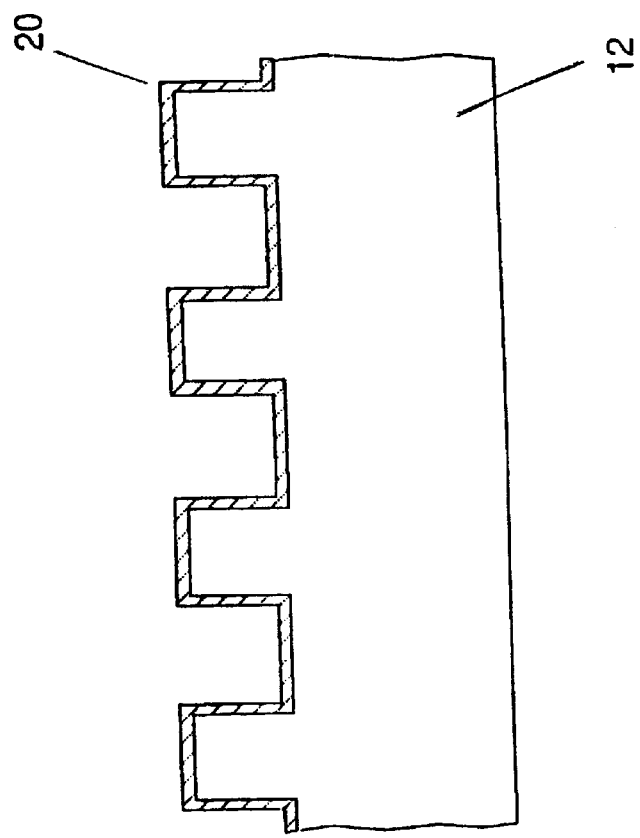
FIG. 7 shows a plating stage.

In FIG. 7 there is shown an additional optional step in which the printing blank has been plated, by way of example with chrome, to add plate layer 20. Layer 20 enables a longer run using the printing blank.

Figure 8:
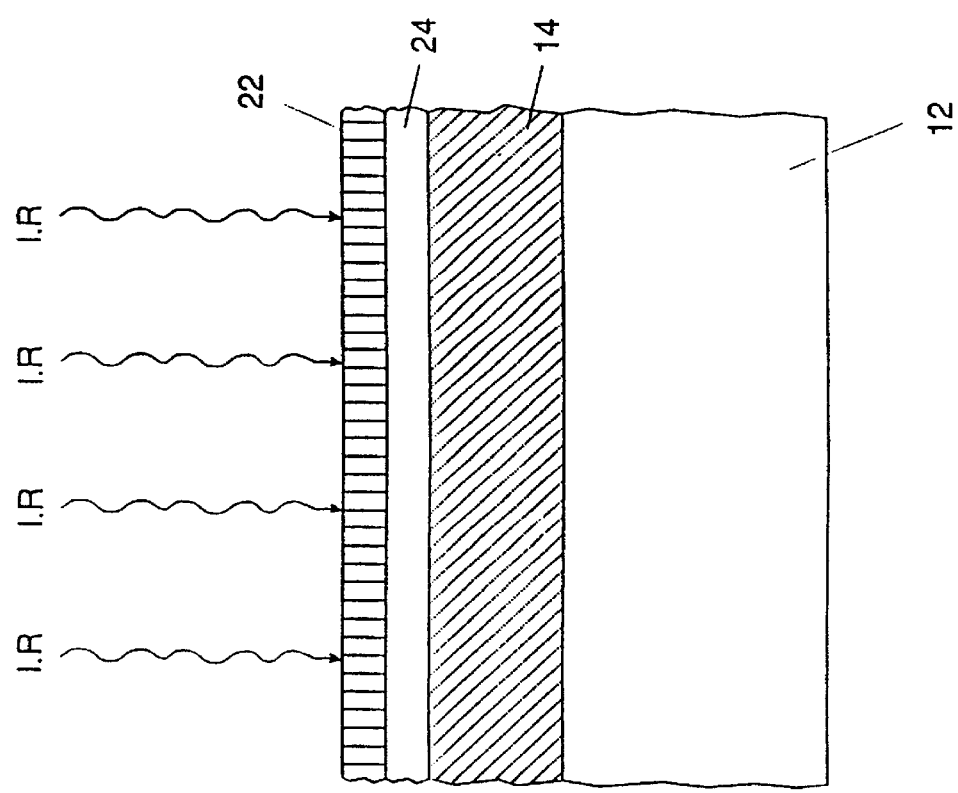
FIG. 8 shows a cross-sectional view of an alternative embodiment of the plate material or cylinder surface, constructed in accordance with an alternative embodiment of the present invention, being digitally imaged in selected areas by infrared radiation.

FIG. 8 shows a further embodiment of the invention. An IR sensitive, UV opaque layer 22 is coated on a thin transparent support 24. Layer 12 is the substrate. As previously, this is either a metal or an anodised or otherwise treated metal surface. The preferred material is slightly grained anodised aluminum. The substrate 12 is coated with a UV curing, aqueous removable layer 14 that may be anything from 5 microns to 50 microns thick as a dry film. The composition of layer 14 is comprised of the same kind of ingredients as described above for layer 14.

The film 24 acts as a protective layer for the surface of layer 14 during handling as well as acting as a carrier film for layer 22. It may be, by way of example, 50 micron polyester or polypropylene. If polyester is used, it may have a release coating on the side in contact with layer 14. Polypropylene does not need such a layer. It is possible to make layer 14 with a tacky surface that encourages contact with the film. Layer 22 may be an easily adjustable coating such as that formed from a mixture of nitrocellulose and carbon black or graphite.

Figure 9:
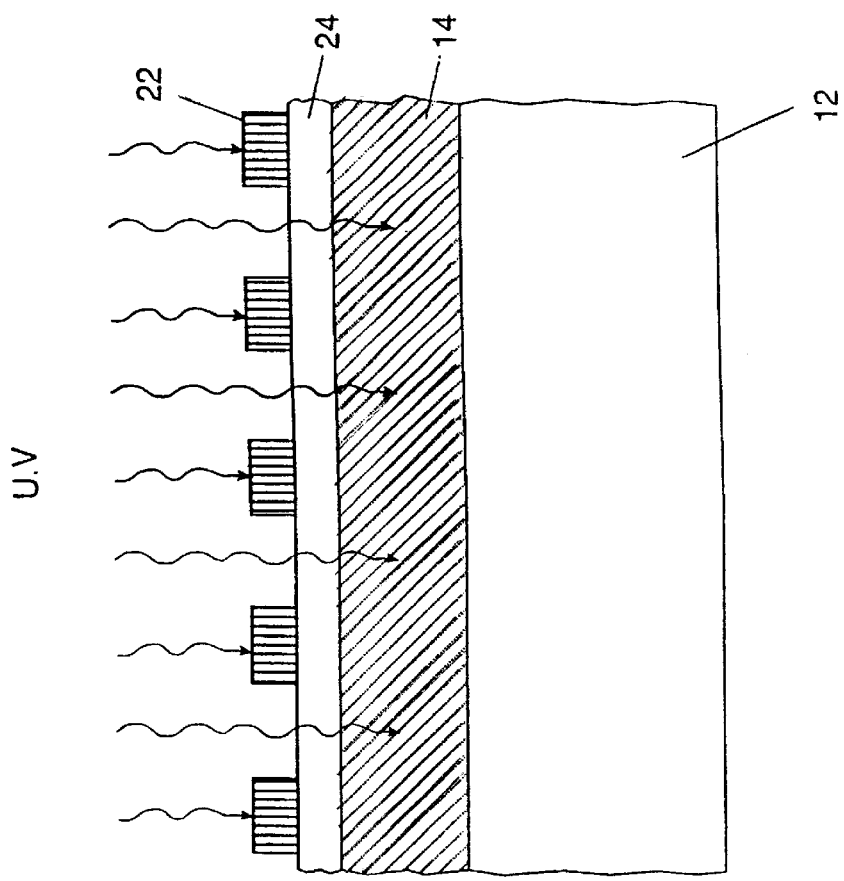
FIG. 9 shows the subsequent stage of flood-exposure with UV radiation.

As shown in FIG. 8, the film 24 is placed, ablatable side uppermost on the UV layer 14 and the printing blank is imaged by IR ablation of layer 22 in the image areas. Ablation can be achieved at very low energies and is processless—i.e. the image needs absolutely no treatment after ablation. The resultant mask is the flood irradiated with UV light. This hardens the areas of layer 14 corresponding to the ablated areas of layer 22, as shown in FIG. 9. Film 24 is then removed, along with the remaining areas of layer 22 by physically peeling off the polypropylene film. It has been found that cured areas of layer 14 lose any stickiness they may have had. Any sticky areas of layer 14 remaining may or may not adhere or partially adhere to the film 24. In either case the image quality remains unaffected, as the wash of the next step will remove these uncured areas in any case.

Figure 10:
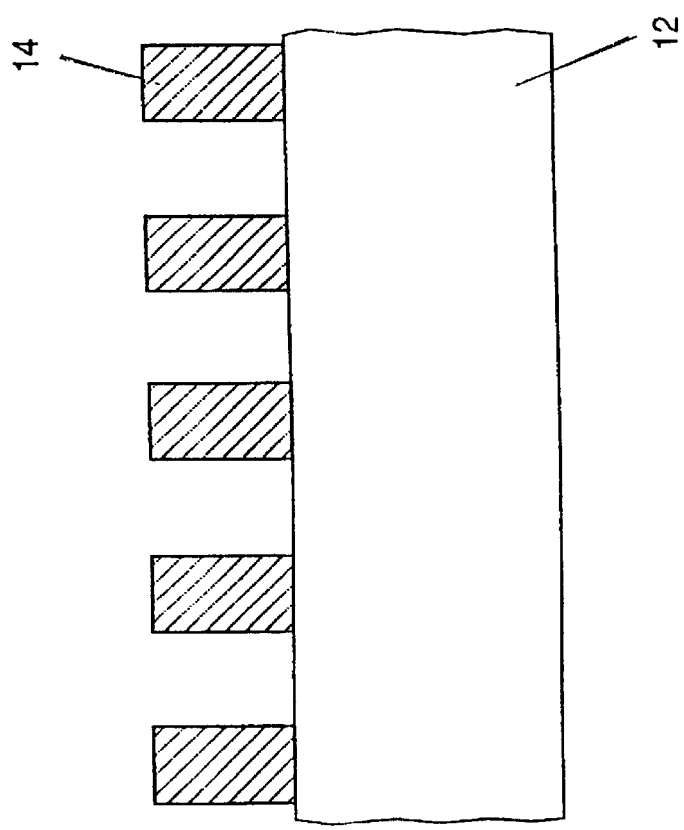
FIG. 10 shows the material after physical removal of the masking film and subsequent alkali wash.

FIG. 10 shows the printing blank after removal of film 24 and after washing out the unhardened areas of layer 14, creating cells 18.

Figure 11:
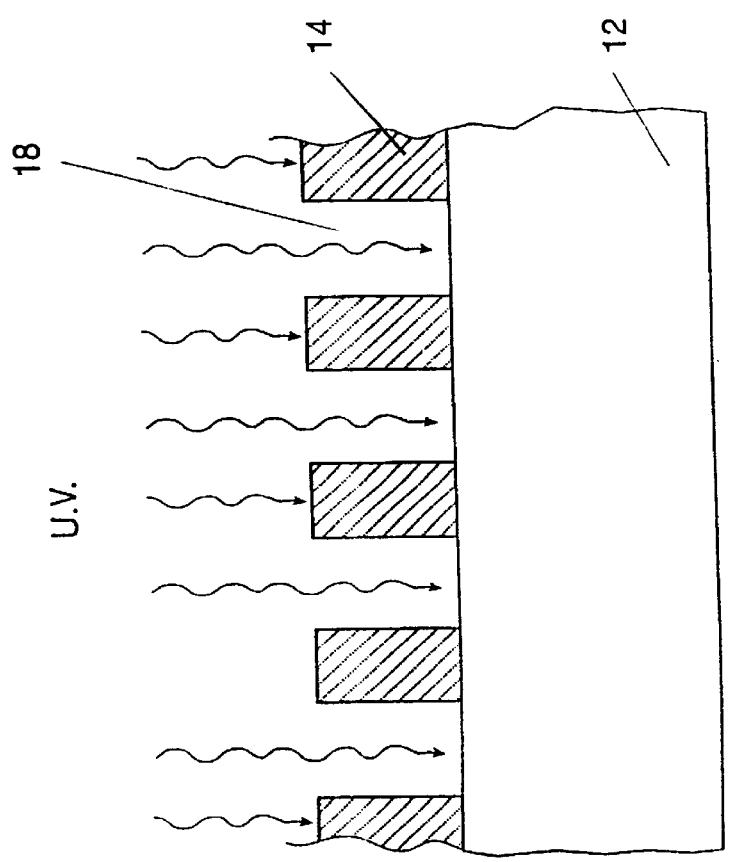
FIG. 11 is a cross-sectional view of an optional UV curing stage.

FIG. 11 shows an optional UV flood-curing stage. It adds to the solvent resistance of layer 14.

Figure 12:
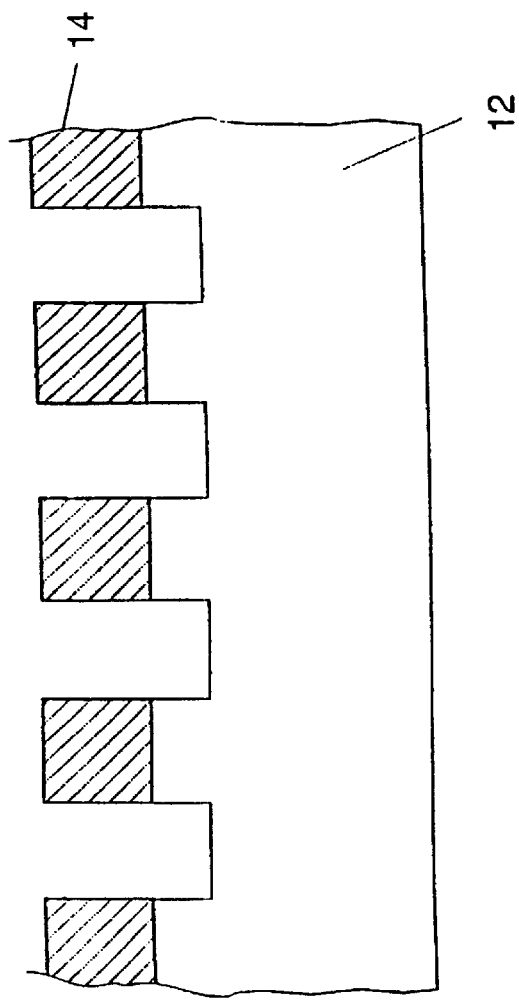
FIG. 12 shows an optional etching of the metal substrate.

FIG. 12 shows a metal etching stage in which cells 18 are deepened so that they extend into layer 12. Optionally, layer 14 may then be removed, as in FIG. 6, and if desired a plating process may provide a layer 20 for extended runs, as in FIG. 7.

Figure 13:
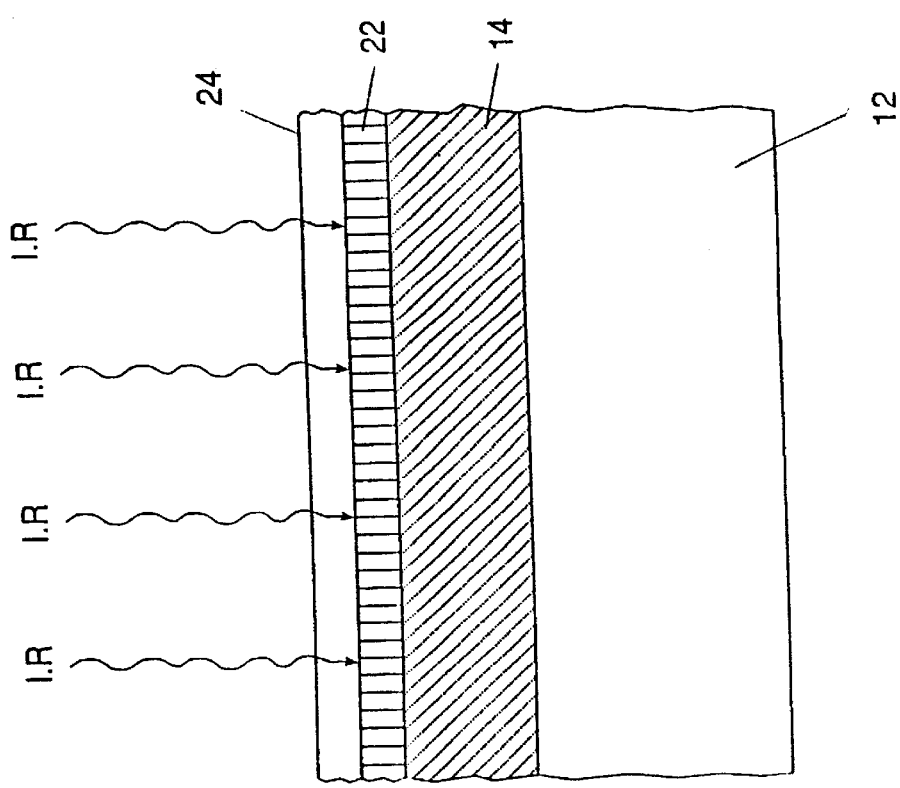
FIG. 13 shows a cross-sectional view of another alternative embodiment of the plate material or cylinder surface, constructed in accordance with a further embodiment of the present invention, being digitally imaged in selected areas by infrared radiation.

FIG. 13 shows a further embodiment of the invention. An IR sensitive, UV opaque layer 22 is coated on a thin transparent support 24. Layer 12 is the substrate. As previously, this is either a metal or an anodized or otherwise treated metal surface. The preferred material is slightly grained aluminum. Substrate 12 is coated with UV curing, aqueous soluble layer 14 that may be from 5 to 50 microns thick as a dry film. The composition of layer 14 is comprised of the same kind of ingredients as previously defined. Film 24 acts as a protective layer for the surface of layer 14 during handling as well as acting as a carrier film for layer 22. It may be, by way of example, 50 micron polyester or polypropylene. Layer 22 is an IR ablation transferable, UV absorbing layer with high release (low surface energy) properties. Preferably, such a layer would contain polysiloxane polymer together with a dispersed carbon black. Preferably, the coating is deposited from aqueous solution. A suitable silicone emulsion is that sold by Wacker under the trade name of DEHESIVE 410E. This emulsion contains a catalyst and needs a separate crosslinker. Other suitable additives may be used to provide the required properties.

As shown in FIG. 13, film 24 is placed with the IR absorbing layer face downwards, so that layer 22 is in contact with layer 14. Although very good contact may be achieved between the coatings, the layer 14 which may have a sticky surface due to the presence of the UV sensitive oligomer will not adhere to the layer 22 because of the low surface energy of the latter. Thus after IR imaging the film 24 is easily physically peeled off. During the IR imaging, ablation transfer occurs in the imaged areas. The areas in which the transfer has occurred are masked against UV light. Contrary to the other embodiments of the invention, this gives a method where the cells are written by the laser and not the cell walls. After imaging, film 24 with the remaining unablated areas of layer 22 is physically removed.

Figure 14:
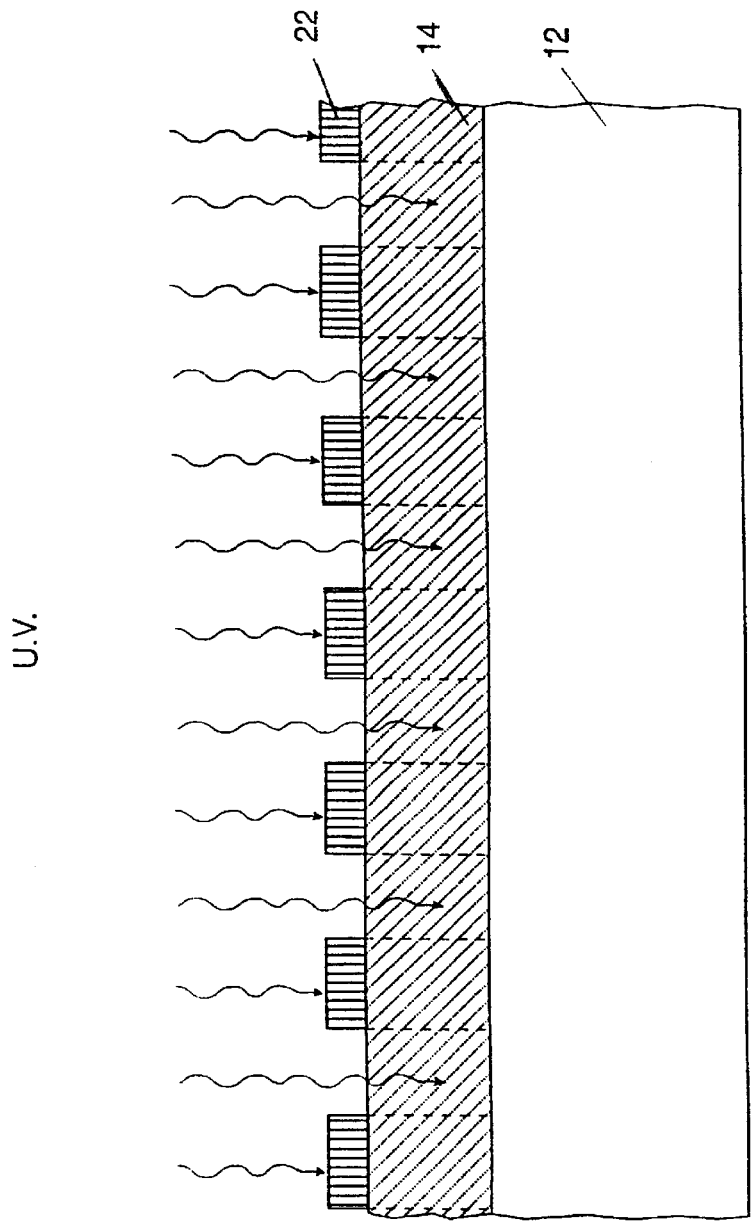
FIG. 14 shows the subsequent stage of flood-exposure with UV radiation after physical removal of the transfer film with untransferred masking material.

FIG. 14 shows flood exposure of the surface with UV light. The ablated areas of 22 act as a photomask, preventing the polymerization of the UV material directly below it.

Figure 15:
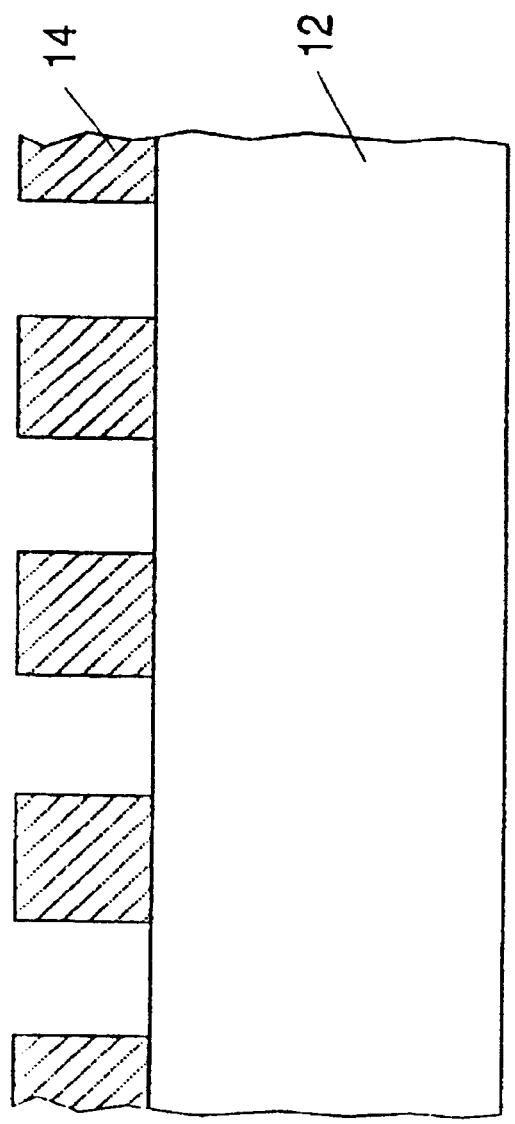
FIG. 15 shows a cross-sectional view after the subsequent stage of alkali wash.

FIG. 15 shows the polymerized material remaining after washing away the non-polymerized material forming the cells for holding ink for the gravure printing process.

It will be understood by those skilled in the art that the optional stages of the second UV curing after the washing step, the baking step, the etching of substrate 12, the removing of remaining layer 14 and the step of plating may be performed on any of the embodiments described above.

EXAMPLE I

The following composition was made up (parts by weight) and milled in a ball mill for 2 hours;

| | | |
|---|---|---|
| | Methyl Ethyl Ketone | 205 parts |
| | Kaolin | 34 parts |
| | Ebecryl 150 | 20 parts |
| | Cab-O-Sil M5 | 8.6 parts |

After milling, the following ingredients (all parts by weight) were added and stirred in, one by one.

| | | |
|---|---|---|
| | Scripset 550 | 21 parts |
| | Ebecryl 1259 | 110 parts |
| | Alsynol RC 12 | 25 parts |
| | Irgacure 184 | 2.8 parts |
| | Irgacure 907 | 4.3 parts |
| | Speedcure ITX | 1.14 parts |
| | BYK 307 | 1.32 parts |
| | Sudan Black B | 0.17 parts |

The mixture was bar coated onto 300 micron grained, anodised aluminum to a dry weight thickness of 30 microns by evaporation of the solvent at 140° C. for 2 minutes. This constituted layer 14 in this example. The following composition was made up;

| | | |
|---|---|---|
| | Cab-O-Jet 200 | 35.2 parts |
| | Water | 10.5 parts |
| | Superwetting Agent | 2.2 parts |

This material was bar coated on top of the previously described layer to a dry weight of 0.8 grams per square meter and air dried. It was not possible to easily measure thickness of this coat as it penetrated the surface of the previous coating and became bound to the extent that it could be handled without causing damage, even though it did not contain any binder itself. The same coat, when applied to uncoated polyester film and dried showed absolutely no adhesion to this surface.

The above composition constituted layer 16 in this example. This finished blank was then mounted on a drum and exposed by laser diodes. This image was in the form of cells. Exposure was such as to create an energy flux of 1100 milliJoules per square centimeter. The imaged plate was flood exposed to UVA UV radiation. The plate was then washed with a solution of the following composition (parts by weight).

| | | |
|---|---|---|
| | Distilled Water | 350 |
| | Sodium Carbonate | 2.2 |
| | Benzyl Alcohol | 4.0 |
| | Sodium lauryl sulphate | 1.8 |

The plate was then rinsed with water, dried and the flood exposed with UV light.

The resulting gravure plate could be mounted on a gravure press and twenty thousand good quality prints made.

EXAMPLE II

The following mixture was made up and ball milled for 6 hours (all parts by weight);

| | | |
|---|---|---|
| | Butyl Acetate | 41.04 |
| | Cellulose Nitrate | 6.573 |
| | Isopropanol | 39.32 |

This was rod coated onto polypropylene to a dry weight of 1.5 grams per square centimeter. The following mixture was made up;

| | | |
|---|---|---|
| | Novalak SMD 30207 | 2.5 |
| | BYK 307 | 0.12 |
| | Methyl Ethyl ketone | 20 |
| | Sudan Black | 0.02 |
| | Ebecryl 270 | 10.0 |
| | SR 9020 | 3.0 |
| | Scripset 550 | 2.0 |
| | Irgacure 369 | 0.4 |
| | Irgacure 2959 | 0.4 |

This was bar coated onto aluminum and dried at 100° C. for 4 minutes to a dry coating weight 30 grams per square meter. The film was sticky and the coated polypropylene film was laid, coated side uppermost on top of it.

The composite was imaged as in Example I, but with an exposure creating an energy flux of 500 mJ/square cm. The image plate was flood exposed with UV light. The polypropylene film was peeled away and the member was soaked in 0.5% by w/w of sodium carbonate in water. The dissolved uncured material was washed away with water and the resulting gravure image was further hardened by curing.

The resulting gravure plate was mounted on a cylinder in a gravure press and 10,000 good quality copies run off.

EXAMPLE III

The following mixture was made up (all parts by weight), each ingredient being added to the previous one(s) with stirring in the order shown and coated to a dry weight of 3 grams per square meter.

| | | |
|---|---|---|
| | Dehesive 410E | 64 parts |
| | Cab-O-Jet 200 carbon | 50 parts |
| | Superwetting Agent | 3 parts |
| | Cymel 373 | 10 parts |
| | V72 cross-linker | 13 parts |
| | Cycat 4045 | 3.4 parts |

This was coated onto 100 micron polyester film and dried by heating for one minute at 140° C.

The following composition was made up (parts by weight) and milled in a ball mill for 2 hours;

| | | |
|---|---|---|
| | Methyl Ethyl Ketone | 205 parts |
| | Talc | 40 parts |
| | Ebecryl 140 | 20 parts |

After milling, the following ingredients (all parts by weight) were added and stirred in, one by one.

| | |
|---|---|
| Scripset 550 | 21 parts |
| CN970A60 | 110 parts |
| Alsynol RC 12 | 25 parts |
| Irgacure 184 | 2.8 parts |
| Irgacure 907 | 4.3 parts |
| Speedcure ITX | 1.14 parts |
| BYK 307 | 1.32 parts |
| Sudan Black B | 0.17 parts |

This was bar coated onto aluminum and dried at 100° C. for 4 minutes to a dry coating weight of 30 grams per square meter. The film was sticky and the coated polyester film was laid, emulsion-to-emulsion on top of it.

The composite was imaged as in Example I, but with an exposure creating an energy flux of 900 mJ/square cm and imaging in the areas of the cells and not of the cell walls. The polyester film was peeled away leaving a transferred mask on the plate. The plate was then flood exposed with UV light and the member was soaked in 0.5% by w/w of sodium carbonate in water. The dissolved uncured material was washed away with water and the resulting gravure was further hardened by curing.

The resulting gravure plate was mounted on a cylinder in a gravure press and 10,000 good quality copies run off.

EXAMPLE IV

The following composition was made up (parts by weight) and milled in a ball mill for 2 hours;

| | |
|---|---|
| Methyl Ethyl Ketone | 420.6 parts |
| Kaolin | 79.24 parts |
| Isobornyl acrylate | 148.8 parts |
| Cab-O-Sil M5 | 19.23 parts |

After milling, the following ingredients (all parts by weight) were added and stirred in, one by one.

| | |
|---|---|
| Scripset 550 | 48.7 parts |
| Isopropanol | 56.9 parts |
| Ebecryl 230 | 148.6 parts |
| Alsynol RC 12 | 56.9 parts |
| Irgacure 184 | 5.23 parts |
| Irgacure 907 | 9.33 parts |
| Speedcure ITX | 2.5 parts |
| BYK 307 | 3.41 parts |
| Sudan Black B | 0.5 parts |

The mixture was bar coated onto 300 micron aluminum to a dry weight thickness of 15 microns by evaporation of the solvent at 140° C. for 2 minutes. This constituted layer 14 in this example.

The following composition was made up;

| | |
|---|---|
| Cab-O-Jet 200 | 35.2 parts |
| Water | 10.5 parts |
| Superwetting Agent | 2.2 parts |

This material was bar coated on top of the previously described layer to a dry weight of 0.8 grams per square meter and air dried.

The above composition constituted layer 16 in this example. This finished member was then mounted on a drum. The image was in the form of cells. Exposure was such as to create an energy flux of 1100 milli Joules per square centimeter. The imaged plate was flood exposed to UVA UV radiation. The member was then washed with a solution of the following composition (parts by weight).

| | |
|---|---|
| Distilled Water | 350 parts |
| Sodium Carbonate | 2.2 parts |
| Benzyl Alcohol | 4.0 parts |
| Sodium lauryl sulphate | 1.8 parts |

The member was then rinsed with water, dried and then flood exposed with UV light.

The surface of the member with the polymerised image upon it was then soaked in the following solution for 8 minutes;

| | |
|---|---|
| Concentrated hydrochloric acid | 84 parts |
| Concentrated phosphoric acid | 27 parts |
| Water | 300 parts |
| Copper chloride | 0.3 parts |

This etched cells into the aluminum. The polymer was stripped off by rubbing vigorously with acetone and the resulting aluminum gravure plate used to print 50,000 copies.

SOURCES OF TRADE NAMED RAW MATERIAL

ALSYNOL RC12 Rosin-maleic resin esterified with pentaerithritol. Manufactured by DSM 3150 AA Hoek van Holland.

BYK 307 Polyether modified polydimethyl siloxane. Manufactured by BYK-Gardner GmbH, Geretsried, Germany.

CAB-O-JET 200 Aqueous dispersion of carbon black. Manufactured by Cabot Corporation, Billerca, Mass., U.S.

CRAYNOR 970A60 Aromatic urethane acrylate blended with ethoxylated trimethylolpropane triacrylate.

CYCAT 4045 Amine blocked p-toluene sulphonic acid. Manufactured by Dyno-Cytec, Botleweg 175, 3197 KA Rotterdam, The Netherlands.

CYMEL 373 Methoxymethly methylol melamine in water (85% solution). Manufactured by Dyno-Cytec, Botleweg 175, 3197 KA Rotterdam, The Netherlands.

DEHESIVE 410E Polysiloxaime emulsion. Manufactured by Wacker Chemie GmbH, Munich, Germany.

EBECRYL 140 Ditrimethylolpropane tetraacrylate. Manufactured by UCB Chemicals, Basle, Switzerland.

EBECRYL 150 Bisphenol derivative of diacrylate oligomer. Manufactured by UCB Chemicals, Basle, Switzerland.

EBECRYL 1259 Aliphatic trifunctional urethane acrylate diluted with 35% hydroxy propyl methacrylate. Manufactured by UCB Chemicals, Basle, Switzerland.

IRGACURE 184 1-hydroxy-cyclohexyl-phenyl-ketone. Manufactured by Ciba Geigy Corporation, CH-4002, Basle, Switzerland.

IRGACURE 907 2-Methyl-1[4-(methylthio)phenyl]-2-morpholino-propan-1-one. Manufactured by Ciba Geigy Corporation, CH-4002, Basle, Switzerland.

NOVALAK SMD 3027 Phenol formaldehyde. Manufactured by Schenectady International Inc., Schenectady, N.Y., U.S.A.

SCRIPSET 550 Secondary butyl ester of styrene-maleic anhydride copolymer. Manufactured by Solutia Europe NV/S.A. Louvain-La-Neuve (Sud), Belgium.

SPEEDCURE ITX Isopropylthioxanthone. Manufactured by Lambson, Castleford, UK.

SUDAN BLACK B Manufactured by BDH Laboratories, Poole, Dorset, England.

Q2-5211 Super wetting agent. Manufactured by Dow Corporation, Midland, Mich., U.S.A.

V72 Crosslinker Manufactured by Wacker Chemie GmbH, Munich Germany.

Having described the invention with regard to certain specific embodiments thereof, it is to be understood that the description is not meant as a limitation, since further modifications may now suggest themselves to those skilled in the art, and it is intended to cover such modifications as fall within the scope of the appended claims.

What is claimed is:

1. A gravure printing blank usable in a gravure printing process said printing blank comprising:
   a printing blank comprised of: a substrate; a UV curing layer comprised of binder resins that are soluble in water, dilute alkali and non-aqueous solvent; and an IR absorbing, UV opaque layer, said IR absorbing, UV opaque layer being deposited from water and interacting with said UV curing layer to provide rub-resistance;
   said printing blank having formed therein cells for holding printing ink for use in the gravure printing process.

2. An image-ready gravure printing blank, comprising:
   a substrate;
   a UV curing layer comprised of binder resins that are soluble in water, dilute alkali and non-aqueous solvent; and UV curing layer being disposed on said substrate; and
   an IR absorbing, UV opaque layer, said IR absorbing, UV opaque layer being deposited from water and interacting with said UV curing layer to provide rub-resistance.

3. The printing blank of claim 2 wherein said substrate is a metal.

4. The printing blank of claim 2 wherein said substrate is an anodised metal.

5. The printing blank of claim 2 wherein said substrate is a metal laminate.

6. The printing blank of claim 2 wherein said substrate is copper.

7. The printing blank of claim 2 wherein said substrate is aluminum.

8. The printing blank of claim 2 wherein said substrate is chromium.

9. The printing blank of claim 2 wherein said substrate is plastic.

10. The printing blank of claim 2 wherein said substrate is polyester.

11. The printing blank of claim 2 further comprising a support film disposed between said UV curing layer and said IR absorbing, UV opaque layer.

12. The printing blank of claim 11 wherein said support film is comprised of polyester.

13. The printing blank of claim 11 wherein said support film is comprised of polypropylene.

14. The printing blank of claim 11 wherein said IR absorbing, UV opaque layer is comprised of a mixture of nitrocellulose and at least one of carbon black and graphite.

15. The printing blank of claim 11 wherein said support film is approximately 50 microns in thickness.

16. The printing blank of claim 2 wherein said UV curing layer is comprised of cross-linkable oligomers and monomers.

17. The printing blank of claim 16 wherein said oligomers and monomers comprise between approximately 25% to 85% of dry weight of said UV curing layer.

18. The printing blank of claim 16 wherein said UV curing layer is further comprised of photoinitiators and synergists that generate and promote free radicals for said cross-linking.

19. The printing blank of claim 18 wherein said photoinitiators and synergists comprise up to approximately 10% by weight of said oligomers and monomers.

20. The printing blank of claim 2 wherein said binder resins are present as approximately 10% to 50% of the dry weight of said UV curing layer.

21. The printing blank of claim 2 wherein said binder resins include at least one of novalak, styrene maleic anhydride copolymers, polyvinyl methyl ether maleic anhydride copolymer and its esters, hydroxy propyl cellulose and esterified rosin-maleic esters.

22. The printing blank of claim 2 wherein said UV curing layer is comprised of at least one of dyes and pigments which are added to aid visual examination of the layer.

23. The printing blank of claim 2 wherein said UV curing layer comprises wetting agents.

24. The printing blank of claim 2 wherein said UV curing layer comprises fillers.

25. The printing blank of claim 2 wherein said UV curing layer is non-aqueous solvent based.

26. The printing blank of claim 2 wherein said UV curing layer is between approximately 5 and 50 microns in thickness.

27. The printing blank of claim 2 wherein said IR sensitive, UV opaque layer comprises carbon black.

28. The printing blank of claim 2 wherein said IR sensitive, UV opaque layer comprises surface active agents.

29. The printing blank of claim 2 wherein said IR sensitive, UV opaque layer comprises at least one of dyes and pigments to enhance performance as a mask.

30. The printing blank of claim 2 wherein said IR sensitive, opaque layer is between approximately 0.3 and 3 microns in thickness.

31. The printing blank of claim 2 wherein said printing blank is provided as a first and a second portion,
   said first portion comprising said UV curing layer provided on said substrate,
   said second portion comprising a support film on which said IR absorbing, UV opaque layer is provided.

32. The printing blank of claim 31 wherein said first portion and said second portion form a printing blank for use in a gravure printing process.

33. The printing blank of claim 32 wherein said first portion is placed on said second portion so that said IR absorbing layer of said second portion is superior to and in contact with said UV curing layer of said first portion.

34. The printing blank of claim 32 wherein said first portion is placed on said second portion so that said support film of said second portion is superior to and in contact with said UV curing layer of said first portion.

35. The printing blank of claim 31 wherein said support film is transparent.

36. The printing blank of claim 31 wherein said support film comprises at least one of polyester and polypropylene.

37. The printing blank of claim 31 wherein said support film is approximately 50 microns in thickness.

38. A method for preparing a gravure printing blank usable in a gravure printing process, said method comprising the steps of:
   providing an image-ready printing blank comprising:
      a substrate;
      a UV curing layer comprised of binder resins that are soluble in water, dilute alkali and non-aqueous solvent; and an IR absorbing, UV opaque layer, said IR absorbing, UV opaque layer being deposited from water and interacting with said UV curing layer to provide rub-resistance;

digitally imaging said printing blank with a digital laser imaging system using an IR laser, such that the IR irradiation causes selective ablation of areas of said IR absorbing layer, forming an image structure having exposed and unexposed areas of said UV curing layer;

flood-curing said printing blank with UV radiation to cure said exposed areas of said UV curing layer in said image structure; and washing said printing blank so that remaining IR absorbing layer areas and said unexposed image structure areas are removed, such that the remaining UV cured image structure areas of the UV curing layer form cells for holding printing ink for use in the gravure printing process.

39. The method of claim 38 further comprising the step of baking said printing blank at approximately 200° C. to 250° C. after said UV curing step.

40. The method of claim 38 further comprising the step of etching said printing blank with at least one of an alkali and acidic solution after said washing step, so as to deepen said cells.

41. The method of claim 40 further comprising the step of removing said UV curing layer by at least one of abrasion or solvent treatment, after said etching step.

42. The method of claim 41 further comprising the step of plating said printing blank after said UV curing layer is removed.

43. The method of claim 42 wherein said plating is chrome plating.

44. The method of claim 38 further comprising the step of flood-curing said printing blank with UV radiation after said washing step.

45. The method of claim 38 wherein said printing blank is provided as a first and a second portion, said first portion comprising said UV curing layer provided on said substrate, said second portion comprising a support film on which said IR absorbing, UV opaque layer is provided, said method further comprising the step of layering said second portion on said first portion to provide a gravure printing blank usable in a gravure printing process.

46. The method of claim 45 wherein said step of digital imaging is accomplished by ablation transfer.

47. The method of claim 38 wherein said washing step is accomplished using an aqueous alkali solution.

48. The method of claim 38 wherein said washing step is accomplished using a non-aqueous non-volatile organic solution.

49. The method of claim 38 wherein after said washing step said blank is UV cured a second time.

\* \* \* \* \*